United States Patent
Li et al.

(10) Patent No.: US 9,517,873 B1
(45) Date of Patent: Dec. 13, 2016

(54) CLEAN STORAGE PACKAGING ARTICLE AND METHOD FOR MAKING AND USING

(71) Applicant: Air Liquide Electronics U.S. LP, Dallas, TX (US)

(72) Inventors: Fuhe Li, San Francisco, CA (US); James Scott Anderson, Dallas, TX (US)

(73) Assignee: Air Liquide Electronics U.S. LP, Dallas, TX (US)

( * ) Notice: Subject to any disclaimer, the term of this patent is extended or adjusted under 35 U.S.C. 154(b) by 828 days.

(21) Appl. No.: 13/630,129

(22) Filed: Sep. 28, 2012

(51) Int. Cl.
  *B65D 81/18* (2006.01)
  *B65B 55/24* (2006.01)

(52) U.S. Cl.
  CPC ............... *B65D 81/18* (2013.01); *B65B 55/24* (2013.01)

(58) Field of Classification Search
  CPC .............. B08B 11/00; B08B 3/08; B08B 9/08; B08B 3/04; B65D 85/38; B65D 81/18; B65B 55/24; B32B 27/08
  USPC ..... 134/3, 26, 27, 28, 42; 53/452; 206/316.1
  See application file for complete search history.

(56) References Cited

U.S. PATENT DOCUMENTS

| | | | |
|---|---|---|---|
| 3,755,042 A | 8/1973 | Robertson et al. | |
| 5,804,744 A | 9/1998 | Tan et al. | |
| 5,996,424 A | 12/1999 | Tan et al. | |
| 6,607,605 B2 | 8/2003 | Tan | |
| 6,663,924 B1 * | 12/2003 | Higashino et al. | 428/34.1 |
| 6,810,887 B2 | 11/2004 | Tan | |
| 7,045,072 B2 | 5/2006 | Tan et al. | |
| 7,067,616 B2 | 6/2006 | Alberg | |
| 7,091,132 B2 | 8/2006 | Tan et al. | |
| 7,316,329 B2 | 1/2008 | Wertenberger | |
| 7,335,721 B2 | 2/2008 | Alberg | |
| 7,377,991 B2 | 5/2008 | Tan et al. | |
| 7,452,475 B2 | 11/2008 | Tan et al. | |
| 2002/0066466 A1 * | 6/2002 | Tan | 134/3 |

* cited by examiner

*Primary Examiner* — Robert Long
*Assistant Examiner* — Xavier A Madison
(74) *Attorney, Agent, or Firm* — Patricia E. McQueeney

(57) ABSTRACT

A packing article for the storage and/or transport of items and materials requiring high levels of cleanliness is described. Methods of making and using the packaging article are also described. The packaging article may be used to store or transport, for example, advanced optical components, or materials and components used in the manufacturing of microelectronic devices or optical components. A method of making the packaging article includes contacting the packaging article with organic solvent(s) and acidic solution(s) and rinsing with ultrapure water. Interior cleanliness levels for various contaminants, such as, metals, anionic materials, organic compounds, and particles may be verified and the packaging articles may be labeled and sorted according to cleanliness level.

19 Claims, 5 Drawing Sheets

CLEAN STORAGE PACKAGING ARTICLE AND METHOD FOR MAKING AND USING

BACKGROUND

Field

The present disclosure relates to a packaging article for the storage and/or transport of items and materials requiring high levels of cleanliness.

Description of the Related Art

Semiconductor and microelectronic devices, components, and sub-assemblies are well known examples of items requiring high levels of cleanliness during their manufacture. Semiconductor and microelectronic devices are generally manufactured in special facilities known as "cleanrooms." Cleanrooms are carefully controlled environments in which special precautions are taken to limit airborne particles and contaminants. These precautions include, amongst other things, constantly filtering the cleanroom atmosphere, requiring workers to wear special garments while in the cleanroom, and limiting materials allowed into the cleanroom. For example, it is common cleanroom procedure not to allow items such as pencils, paper, chalk, cosmetics, or cardboard inside the cleanroom because these items shed particles or generate dust.

Cleanrooms are expensive to build and maintain, but the expense is necessary since it is well known that even small increases in particle and contaminant levels present during manufacturing may adversely affect process yield and device performance. As integrated circuit feature dimensions have decreased, cleanliness has become even more critical, so, accordingly, additional efforts have been made to improve cleanrooms. Improved air filtering, tighter controls on allowable materials, and better cleanroom garments for workers have all been pursued, and today cleanrooms with fewer than ten particles (of a size greater than a half micron) per cubic foot are common.

But increasingly, the process for manufacturing semiconductor devices involves multiple facilities, each of which might be separated by thousands of miles. A manufacturer may perform certain processing steps at a specialized plant located in North America, and then ship partially completed wafers to another plant in Europe or Asia for completion and final processing into individual microchips. Or the manufacturing process may require materials, equipment, and component parts to be shipped between clean facilities. Shipping intermediate components and materials from one manufacturing facility to another means components and materials must be removed from the protection of the carefully controlled cleanroom environment and may therefore face possible contamination unless suitably protected. Therefore, a need exists for a packaging solution for items and materials requiring high levels of cleanliness.

SUMMARY

It is an object of the present disclosure to provide an economical storage solution for clean items and materials. In one embodiment, the storage solution comprises a packaging article of fluoropolymer composition that has been cleaned to remove contaminants and particles generated by its manufacture or subsequent handling. A method of manufacturing clean packaging articles and a method of using clean packaging articles for the storage and transport of items is also disclosed.

BRIEF DESCRIPTION OF THE DRAWINGS

So that the manner in which the above recited features of the present disclosure can be understood in detail, a more particular description of the various aspects, briefly summarized above, may be had by reference to example embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
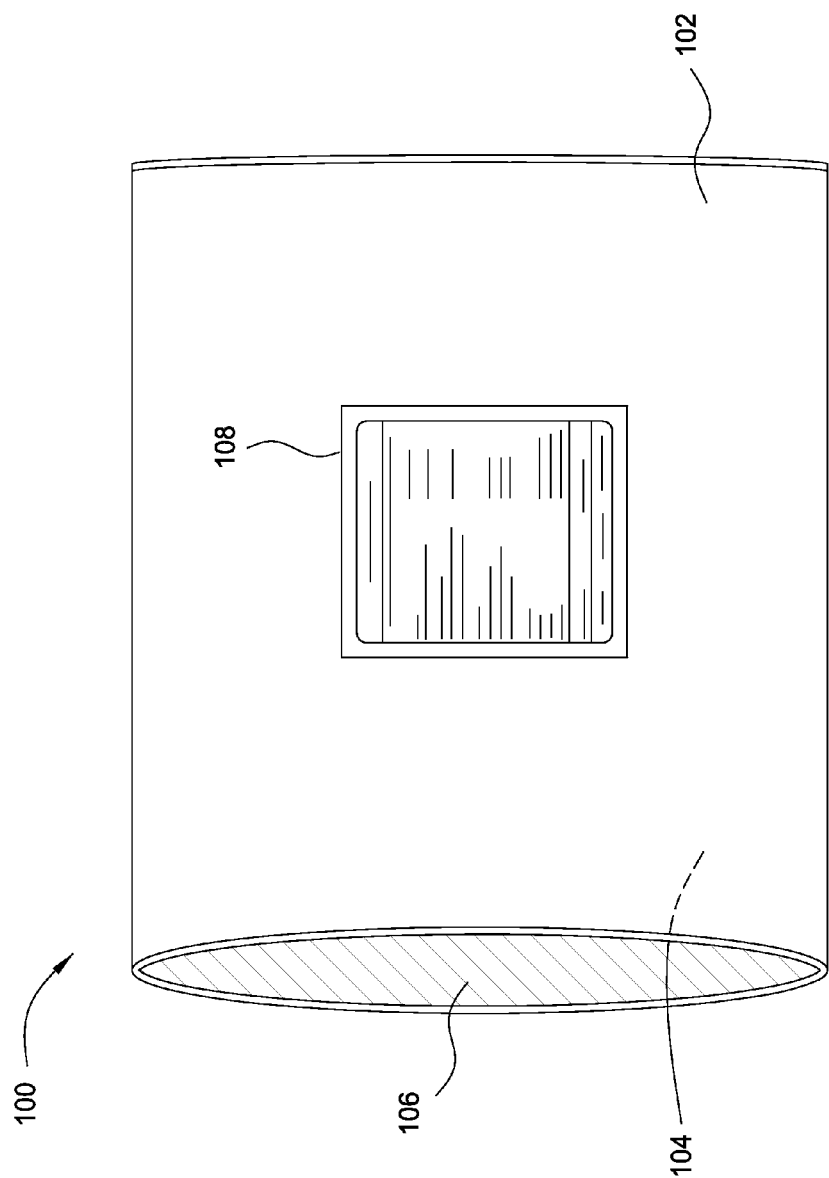
FIG. 1. A depiction of an example embodiment of a packaging article according to the present disclosure.

Embodiments disclosed herein provide a packaging article particularly adapted for items and materials requiring high levels of cleanliness. By way of example, certain embodiments may be described by reference to potential uses in the semiconductor industry, but the present disclosure is not limited to such specific uses.

In the semiconductor industry, shipping or storing an intermediate device component typically involves placing it in a protective storage container, for silicon wafers these containers are usually specially designed wafer carriers. The protective storage container is then sealed within a plastic bag. This plastic bag is sometimes referred to as an "inner packaging bag," and generally corresponds to an embodiment of the packaging article of this disclosure. The inner packaging bag will generally be placed inside an additional outer container, such as another plastic bag, before complete removal from the cleanroom environment. This additional outer container generally corresponds to an embodiment of the packaging article of this disclosure. Once outside the cleanroom environment, the inner packaging bag and the storage container may then be placed in an additional shipping container or containers, such as a shipping crate or box suitable for transport or warehousing.

When bringing items that have been shipped or stored outside of a cleanroom back into a cleanroom, the common procedure is to remove the shipping containers (the crates/boxes) in a loading area outside of the cleanroom. The remaining outer container will then be wiped down and cleaned before being taken to a cleanroom antechamber. In the antechamber, the additional outer container may then be removed before the remaining inner packaging bag containing the intermediate device components or materials is taken into the cleanroom. The outer surface of the inner packaging bag may be wiped down before the items are passed into the cleanroom. Only after it is once again inside a cleanroom will the inner packaging bag be removed and disposed leaving only the protective storage container.

Inner packaging bags used by the semiconductor industry today are most commonly made of nylon or polyethylene. Semiconductor manufacturers currently use nylon or polyethylene bags as-supplied without any attempt to clean the bags before use. Nylon and polyethylene bags are relatively inexpensive, but they also have various surface contaminants, which given the cleanliness standards required by semiconductor devices, may be detrimental to process yield and device performance.

Contaminant levels of current bags may vary lot-to-lot and/or bag-to-bag, but various organic and metallic contaminants appear to be inherent to making of the bags themselves. Organic contaminants, such as machine oil residue, may come from the machinery used to form the bags or from handling of the bags during manufacturing. Even handling of the bags by workers without gloves can impart oils and residues to the bags. Metallic contaminants also may come from the bag making machinery as friction rubs bits of the machinery into dust. It is well known that heat welding nylon (for example, to form a bag) generates caprolactam ($C_6H_{11}NO$) residues which may be a contaminant. Various metallic or anionic compounds may also be present in the nylon and polyethylene materials themselves as impurities or residual catalyst molecules left over from various polymer synthetic processes.

Placing components and materials in a packaging article already containing potential contaminants increases the possibility components and materials will become contaminated, as such it would be advantageous to eliminate or reduce such contaminants before the bags are used as inner packaging. To this end, the present disclosure provides packaging articles for storage/transport of items requiring a high level of cleanliness, and further provides cleaning methods for producing such articles. While such packaging articles may be particularly well-suited for storing or transporting semiconductor components, all other applications requiring packaging articles of a high level of cleanliness are contemplated. Therefore, references to the semiconductor industry and semiconductor components are merely illustrative.

Example Packaging Articles

Referring now to FIG. 1, an embodiment of a fluoropolymer packaging article 100 is shown. In general, the packaging article 100 includes a body 102 that forms an enclosure 104 sized to accommodate the storage of an item (e.g., a semiconductor component). The enclosure 104 is accessible through an opening 106 sized to allow transfer of the item(s) into the enclosure 104. Illustratively, the opening is formed at one end of the body. However, the opening may be formed at other locations, such as in the middle portion of the body. Further, the packaging article 100 may be provisioned with multiple openings.

The body 102 may be made of a fluoropolymer material, such as perfluoroalkoxy (PFA), polytetrafluoroethylene (PTFE), fluorinated ethylene propylene (FEP), perfluoropolyether (PFPE), or polyvinylidene fluoride (PVDF). Fluoropolymers have polymeric repeat units with structures having fluorine atoms covalently bonded to carbon atoms. Fluoropolymers may be a homopolymer or may be a co-polymer of different fluorocarbon monomers or fluorocarbon monomers and hydrocarbon monomers. Fluoropolymers may also contain other halogens, such as chlorine, in addition to fluorine, such as in polychlorotrifluoroethylene (PCTFE) (a polymer formed from chlorotrifluoroethylene). The co-polymers maybe alternating, block, or periodic. It should be understood that the above list is not exhaustive and other fluoropolymer materials, including various co-polymers involving precursors of the above materials, could be suitable as well.

In general, fluoropolymer packaging articles will be more stable in both organic solvents and acidic solutions than a packaging article composed of nylon. This stability in organic solvents and acidic solutions allows fluoropolymer packaging articles to be cleaned according the present disclosure to make the fluoropolymer packaging articles suitable for storage of items or materials requiring high levels of cleanliness. Nylon materials are generally more susceptible to swelling and/or dissolution by organic solvents than a fluoropolymer material would be. And some stronger acidic (nitric acid and sulfuric acid, for example) solutions may even dissolve or breakdown common nylon resins, thus nylon materials cannot effectively be cleaned according to embodiments of the present disclosure.

Unlike nylon, some polyethylene materials may be relatively stable in stronger acidic solutions, as there are many types and variants of polyethylene. But commercial grade polyethylene resins (the resins used to make packaging bags) generally contain residual metallic catalyst molecules, which fluoropolymer resins do not. Any metallic catalysts used in the synthesis of polyethylene materials will generally be present in the final articles. This residual catalyst prevents polyethylene materials from being cleaned to levels achieved by fluoropolymer materials. Therefore, a body 102 made of fluoropolymer materials may be preferred, but other materials are contemplated as alternative embodiments even where the resulting level of cleanliness is relatively less than what may be achievable with fluoropolymer materials.

In some embodiments, the body 102 may be rigid or flexible, or partially rigid and partially flexible. Further, the body 102 may be opaque or translucent or a combination of opaque and translucent, such that, for example, the packaging article 100 may be generally opaque but have a translucent window or windows which may function as view ports into the enclosure 104. Body 102 may comprise a single piece or may comprise multiple pieces joined together.

Figure 2:
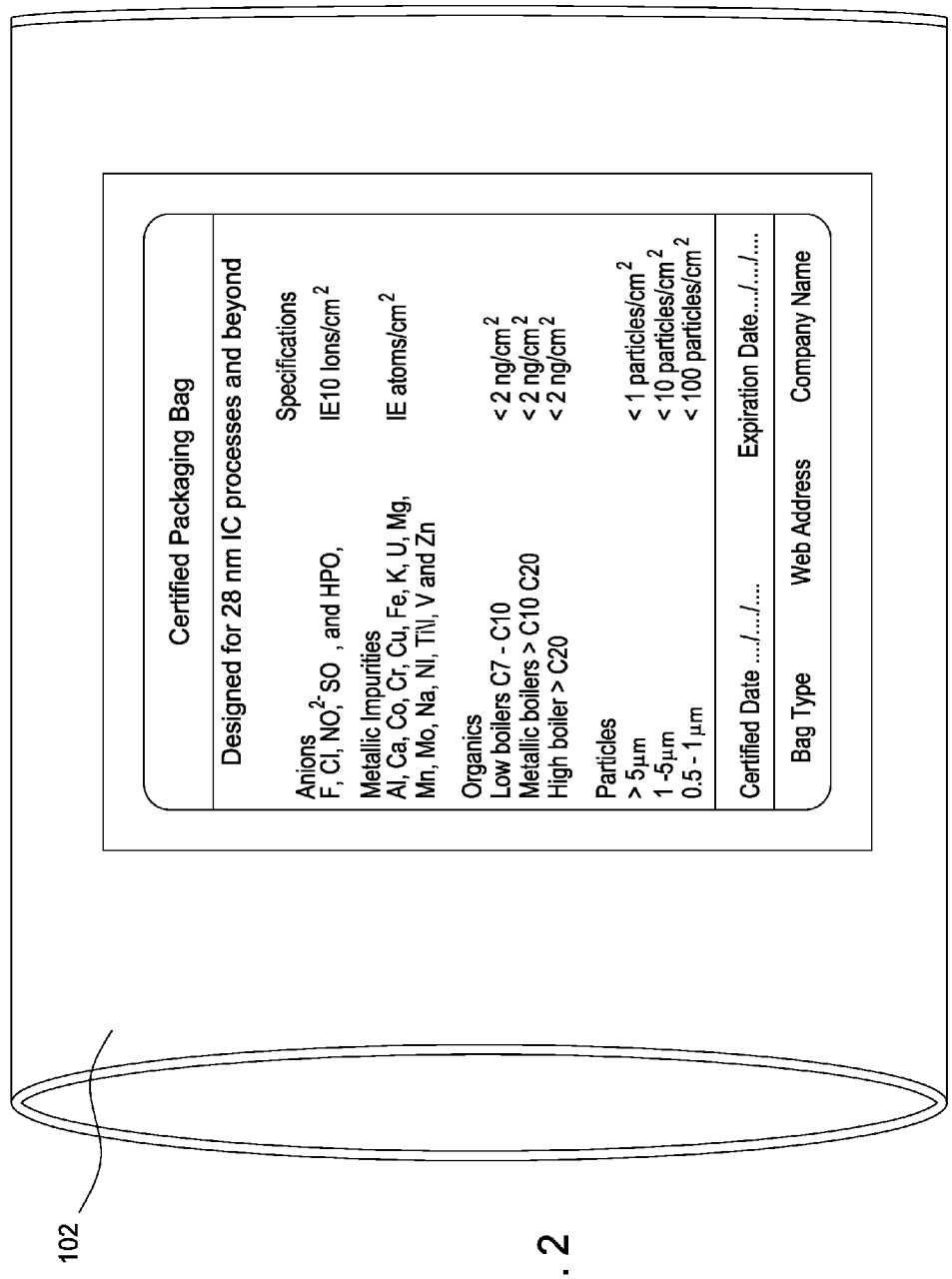
FIG. 2. A depiction of an embodiment of a packaging article label.

Body 102 may optionally have a label 108 disposed on an exterior surface or otherwise formed in a surface. Label 108 may, for example, be an adhesive label applied to an exterior surface or may be formed into a surface using an embossing, molding, or etching method. Label 108 may provide information concerning the packaging article's contents, cleanliness specifications, composition, safe usage, or other information relevant to potential users or handlers of the article. A particular example of a label 108 is shown in FIG. 2. Illustratively, the label 108 depicted in FIG. 2 shows four categories of contaminants; namely, measured levels of various anionic, metallic, organic, and particle contaminants. Each category of contaminants may include one or more values (e.g., $F^-$ and $Cl^-$ under "anions") as we well as one or more cleanliness specification (e.g., $1 \times 10^{10}$ Ions/cm$^2$, sometimes numbers of this sort may be equivalently denoted as 1E10 Ions/cm$^2$). The label 108 may include additional information such as trade names, company information, manufacturing and/or certification dates. The label depicted in FIG. 2, is an example only and more or less or different information than shown may be incorporated on a label 108.

When label 108 is an adhesive label, such information may be printed onto the label prior to, or after, being affixed to the packaging article. In one embodiment, the information is in the form of alphanumeric characters that can be read directly by a human-being (such as is exemplified by the label of FIG. 2). Alternatively, the label may be encoded in some computer readable format, such as a QR code. An appropriate reader, e.g., QR code scanner, reads the computer readable label and displays the package/content information on a display. In still another embodiment, the label is stored on an RFID disposed on the body 102. An RFID reader is brought into the vicinity of the tag to read and display the label information.

The packaging article 100 may be formed and/or sealed using heat welding methods. Energy for welding may be supplied by a variety of methods including heated metals, infrared light, lasers, ultrasound, or microwaves. Other welding methods, such as solvent welding, may also be used to seal or form the packaging article without departing from the scope of this disclosure. Rather than (or in addition to) welds, body 102 may be sealed and/or formed using adhesives or mechanical fasteners, such as clamps, clips, ties, screws, rivets, or the like. The method used to seal and/or form the packaging article 100 may be temporary, such as with a folding and clamping method when the packaging article has flexible portions, or may be of more permanent nature such as with a weld. A mechanical sealing mechanism such as a zipper or friction sealing methods commonly found in food storage bags may be optionally incorporated for sealing opening 106, but this would generally not be preferred since friction sealing methods will generate additional particles with each opening and closing of the mechanism, which might compromise the cleanliness of the packaging article.

In a particular embodiment, the packaging article 100 may be in the form of a bag. A bag for purposes of this disclosure encompasses any packaging article formed primarily of a flexible plastic in which an item or material can be placed and then substantially sealed from the outside environment within an enclosure region. An open bag has an opening or openings through which items and materials can be inserted into or removed from the enclosure or pocket region. A closed bag is an open bag that has had its opening or openings sealed. Sealing may be accomplished by a variety of means and may, but need not, achieve hermetic or air tight enclosure.

A bag may be formed in a variety of ways. For example, the bag may comprise a single plastic sheet folded upon itself and welded along its overlapping edges to form the enclosure 104. The bag could be formed by folding a single rectangular sheet once upon itself at a point approximately midway between two corners and welding two of the resultant three overlapping sides. Or an open rectangular bag could be formed by welding two stacked rectangular sheets along three sides of the rectangle. A closed rectangular bag could be formed by welding two stacked rectangular sheets along four sides of the rectangle. An opening 106 could then be formed by cutting into the closed bag. A bag may also be formed out of non-rectangular sheets, such as circular, polygon, or irregular shaped sheets, by similar edge welding and/or folding methods.

Optionally, the bag may comprise multiple sheets arranged in layers such that each wall of the enclosure 104 is formed of multiple layers. The bag may be provided with pleats or folds allowing expansion of the enclosure 104 to accommodate the placement of items within. The bag may further include a label 108 for providing information to potential users or handlers of the bag.

Example Cleaning Methods

To lower the particle and contaminant counts and make the packaging article suitable for storage of items requiring high levels of cleanliness, the packaging article 100 may be subjected to cleaning steps designed to reduce organic, metallic, and/or anionic residues or impurities on the article's surfaces. In one aspect, the disclosed cleaning process may also work to improve overall particle counts within the packaging article.

Figure 3:
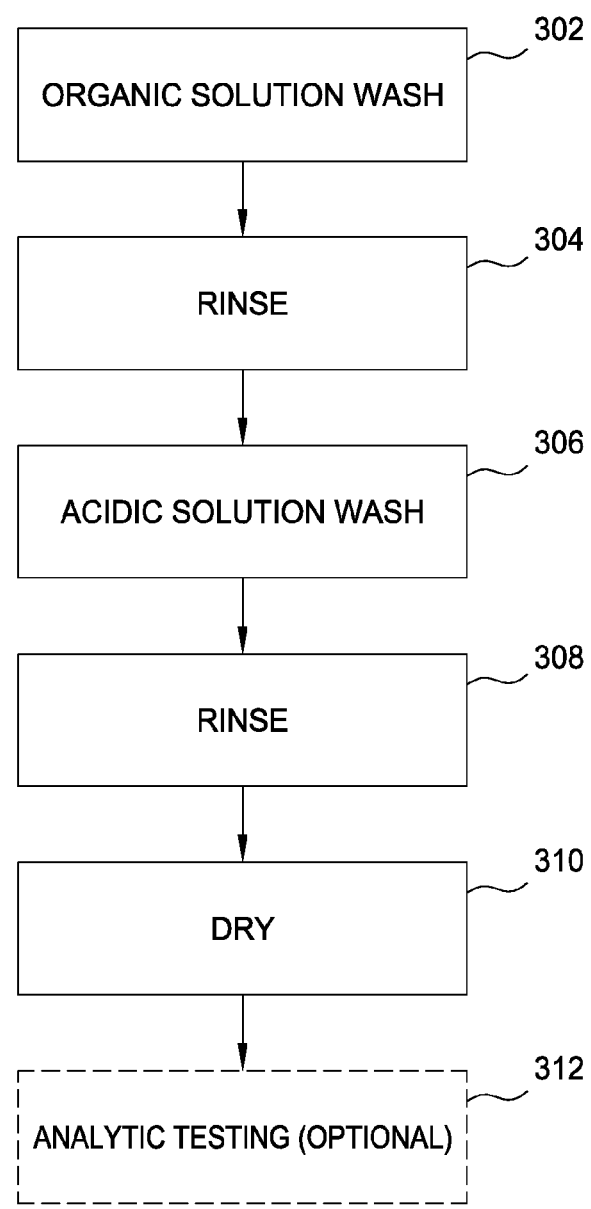
FIG. 3. A flowchart depicting an example embodiment of a process for cleaning packaging articles.

An example embodiment of a multi-step cleaning process (process 300) for fluoropolymer packaging articles is schematically depicted in FIG. 3. The example cleaning process begins with an organic solvent wash (step 302). The organic solvent used for this wash step could be pure isopropyl alcohol (IPA), for example, but other organic solvents, such as acetone, benzene, and methanol, may be selected provided the selected solvent does not dissolve, react with, or significantly swell the fluoropolymer resin comprising the packaging article. Fluoropolymers are well known for their ability to withstand organic solvents, so a wide variety of potential organic solvents are available. Rather than being a single organic solvent, the organic solvent wash may comprise admixtures of different organic solvents in various ratios or may comprise a sequence of organic solvents applied one after another. In general, the organic solvent (or solvents) selected should have low particle counts and not add significantly to metallic or anionic contaminants already present on the packaging article.

After the solvent wash, the packaging article is rinsed (step 304). In one embodiment, this rinse step may be performed with ultrapure water (UPW). UPW may also be referred to as "de-ionized and filtered water." UPW should be understood to include any high purity water of a type suitable for semiconductor processing. The rinse may comprise a bath, soak, or leach process or may comprise continuously flowing UPW over the surfaces of the packaging article. The rinse step may comprise a single rinse or sequence of individual rinses one after the other with the rinse water disposed of between individual rinses. The rinse step may comprise a combination of individual baths, soaks, leaches, or flowing water steps. The rinse step may involve agitation, including potentially ultrasonic agitation.

Next, the packaging article is exposed to an acidic solution wash (step 306). The acidic solution wash is intended to extract or remove metallic/anionic contaminants, so acids should preferably be selected such that they are capable of bringing target contaminants into solution. Solubility of metal ions in various acid solutions is available in standard chemistry literature. Thus, it is contemplated that the acidic solution wash may comprise a variety of potential acids and concentrations. It is also contemplated, that the packaging article may be exposed to a sequence of separate and chemically different acidic solutions. In a particular example, the acidic solution could be 1% (w/w) aqueous nitric acid ($HNO_3$). As an example of a mixture of acids, the well-known mixture of sulfuric and nitric acids ("aqua regia") that dissolves gold and platinum could be used. The acidic solution could also include additional components such as hydrogen peroxide ($H_2O_2$) to promote oxidation of organic contaminants, such as in the mixture of sulfuric acid ($H_2SO_4$) and hydrogen peroxide commonly referred to as "piranha etch."

The acidic solution wash is followed by a second rinse (step 308), which may be performed according to the general description above for the first rinse step (step 304). But it should be noted that the first and second rinse steps need not be performed in an identical manner.

The packaging article is then dried (step 310). The drying process may involve air drying (evaporation) in a filtered environment. But vacuum ovens, forced air/gas drying, heating and the like may also be used. The packaging article may be continuously or intermittently rotated, shaken, or otherwise agitated during the drying process. Alternatively, the packaging article may be left stationary and particle filtered air/gas may be blown over the surfaces of the packing article.

If desired, the cleaning steps can be repeated. The order of the solvent wash and the acidic solution could be reversed, but this is generally not preferred because certain organic surface contaminants, say an oily smudge, might prevent an aqueous acid solution from fully scouring the packaging article's surface for metal/anionic contaminants.

Wash steps (steps 302 and 306) involve bringing the packaging article into contact with a solvent/solution and such contact may comprise soaks or leaches wherein the solvent or acidic solution is left in stagnant contact with the packaging article's surfaces. Or wash steps may involve agitation of the wash fluid by stirring or shaking or the like. Wash steps may also comprise continuous flows of solvent or acid solutions over the packaging article's surfaces, such as, for example, in a shower apparatus. The wash steps may comprise sequences or combinations of soaks, leaches, agitations, or showers.

Solvent and/or acid solutions may be changed or renewed after each packaging article is washed or several packaging articles may be washed in sequence in the same bath/shower before the solvent or solution is changed (though the effectiveness of a wash solvent or solution would be expected to degrade with repeated use). Several packaging articles may also be washed at the same time in a single tank, bath, or shower, if desired.

After the cleaning process, contaminant and particle counts remaining on the packaging article's interior surfaces can, optionally, be measured by performing various analytical tests on rinse (or wipe) samples from the packaging article's surfaces (step 312). For example, a laser particle counter can give a particle count and particle size distribution and various chromatography techniques can be used to estimate remaining levels of organic, metallic or anionic contaminants. The various analytic results can then be used to sort packaging articles (or packaging article lots) by cleanliness, such that the cleanest packaging articles can be reserved for the most contaminant sensitive or important applications.

Figure 4:
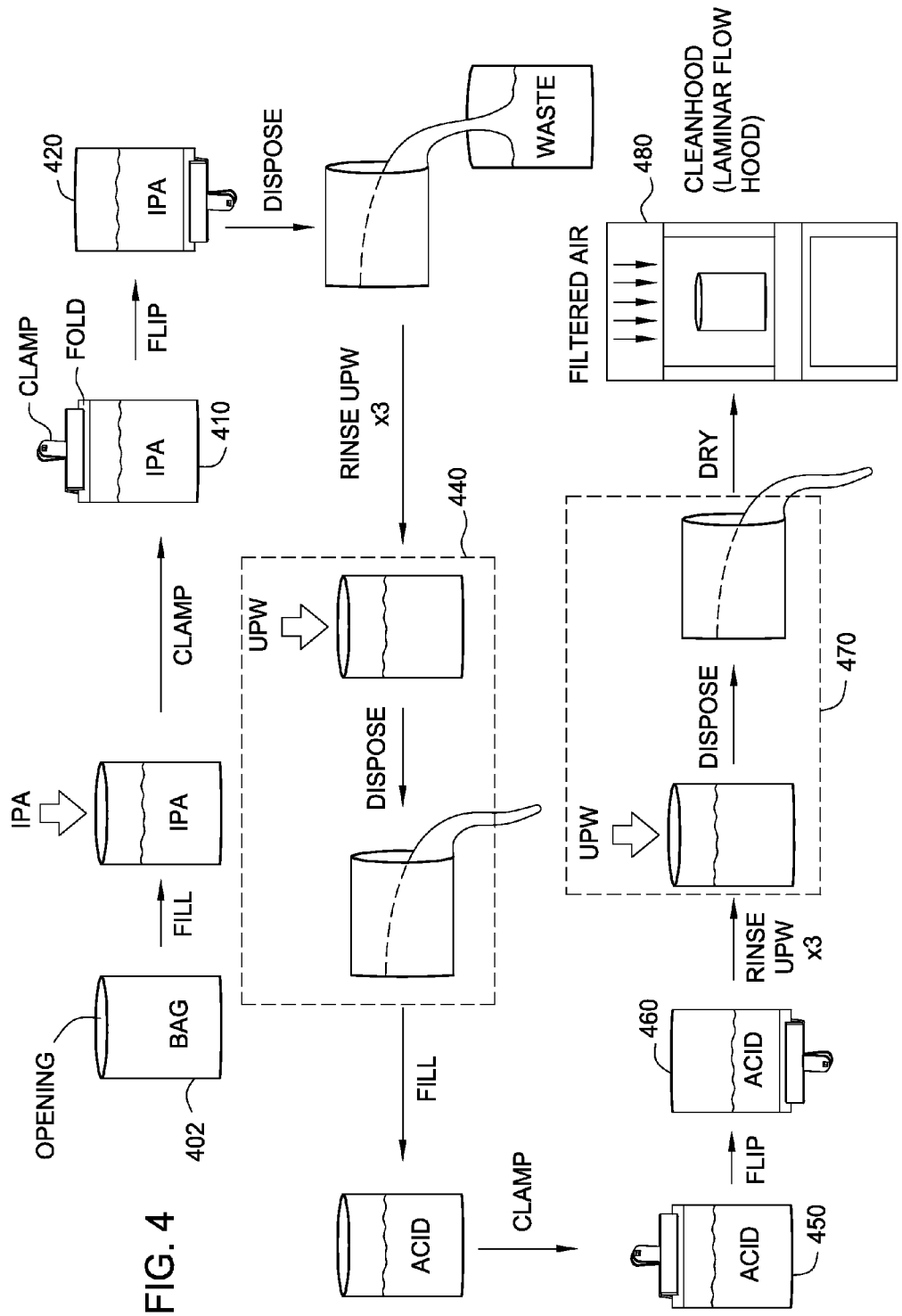
FIG. 4. A schematic overview of an embodiment of the cleaning method.

A specific example embodiment of the cleaning process 300 is described as follows, with reference to FIG. 4: First, a fluoropolymer bag 402, for example a PVDF bag, is obtained. In this example embodiment, the organic wash step (step 302) comprises two separate stagnant leach steps (410 and 420). For the first leach step bag is filled with IPA until it is approximately half full or more. The bag is then folded and clamped so as to prevent the liquid (IPA) from escaping the bag, as depicted in FIG. 4. The IPA is left to sit in the bag for a time exceeding 60 minutes. After the elapsed time, the bag is then rotated and/or flipped such that the any portions of the bag interior not initially in contact with the IPA are brought into contact with the IPA and the second stagnant leach step 420 is started. The IPA is left to sit in the rotated/flipped bag for a time exceeding 60 minutes. The organic wash step is completed when the IPA is emptied from the bag in to a waste disposal collection system 430. The length of the stagnant leach steps in this example is 60 minutes or more, but this time is only an example and the time may be less than 60 minutes in some circumstances. The length of the leach step may vary in length according to initial cleanliness of the bag, solvent type, temperature, or other process parameters.

The rinse step (step 304) is, in this embodiment, a sequence of three separate rinses with UPW (a "triple rinse"). For each individual rinse (440), UPW is applied to the interior surfaces of the bag and then disposed. As stated, this is done three times before the next wash step (step 306) is started.

In this example embodiment, the acidic solution wash (step 306) is performed following the organic solvent wash step (step 302) and the rinse step (step 304). The acidic solution wash (step 306) in this example comprises two separate stagnant leach steps (450 and 460). To begin the acidic solution wash, the bag is partially filled approximately half full with an aqueous nitric acid solution (1% (w/w)). The bag is then again folded and clamped, as depicted in FIG. 4. The bag is left to sit for no less than 60 minutes. After the elapsed time has been met, the bag is then rotated and/or flipped such that the any portions of the bag interior not initially in contact with the acidic solution are brought into contact with the acidic solution. The nitric acid solution is then left to sit in the rotated/flipped bag for a time exceeding 60 minutes. This acidic solution wash step is completed when the nitric acid solution is emptied from the bag and disposed. The length of the stagnant leach steps in this example is 60 minutes or more, but this time is only an example and the time may be less than 60 minutes in some circumstances. The length of the leach step may vary in length according to initial cleanliness of the bag, solvent type, temperature, or other process parameters.

After the acidic solution wash step of this embodiment, the bag is again rinsed in a rinse step (step 308) with UPW similar to the previous rinse step (step 306) after the organic solvent wash. In this example, this second rinse step is, like the first rinse step, a triple rinse with UPW. For each individual rinse (470), UPW is applied to the interior surfaces of the bag and then disposed. As stated, this is done three times before the drying (step 310) is started.

After the second rinse step, the bag is placed in a high efficiency particulate air ("HEPA") filtered laminar flow hood 480 to dry over time. A HEPA-filtered laminar flow hood is sometimes referred to as a "clean hood." The bag may be placed in the hood with its opening either facing the flow of filtered air or may be placed with its opening facing away from the flow. To speed drying, the bag may be clamped or restrained such that its interior is substantially open such that bag sidewalls are not in significant contact. Multiple bags may be placed in the drying apparatus simultaneously or they may be dried in sequence.

If desired, the effectiveness of the described example cleaning process may be evaluated with various analytical techniques (step 312). Trace metals may be measured by, for example, ICP-MS (Inductively Coupled Plasma Mass Spectrometry) on sample drawn from a nitric acid solution rinse. Organic contaminants may be measured by GC-MS (Gas Chromatography-Mass Spectrometry) on a sample drawn from an IPA rinse. Anionic contaminants may be measured by ion chromatography on an UPW rinse. Overall particle counts may be evaluated using a laser particle counter to measure particles extracted from the bag in a UPW rinse. Particle and contaminate counts are generally measured per unit of bag surface area ($cm^2$), so the analytic samples must be taken from a known surface area.

Additional, contaminants, including biologically relevant counts such as microbe levels, may be measured and collected without departing from the spirit of this disclosure. The listed contaminant types and analytic methods are by way of example only. More or fewer categories of contaminants may be relevant to some applications. And different analytic methods may be capable of producing similar or equivalent measurements for certain contaminant types.

Individual packaging articles may optionally be sorted according to specific analytic test results. Or rather than individual test results, statistically significant samples from a specific cleaning lot may be used to sort packaging articles according to cleanliness level. Packaging articles may be sorted by level of cleanliness into groups corresponding to levels appropriate for intended uses. For example, packaging articles may be sorted by cleanliness levels (or ranges of cleanliness levels) into classes suitable for different semiconductor design nodes (e.g., 45 nm node, 22 nm node, or 14 nm node). The packaging articles may also (or instead) be sorted by levels of specific contaminants, such that, for example, packaging articles with the lowest overall particle counts may be reserved for usage with advanced optical components, while packaging articles with the lowest levels of a metallic contaminates may be reserved for use with semiconductor devices with long operational lifetime requirements or mission critical applications, such as microcontroller units in medical devices.

Example Uses

After cleaning, the fluoropolymer packaging article can be used to store and transport clean items, for example advanced optical components. Clean items or materials can be inserted through opening 106 and placed inside enclosure 104 of body 102. The packaging article may optionally be sealed using a method such as folding, clamping, taping, applying adhesives, welding, or the like.

Figure 5:
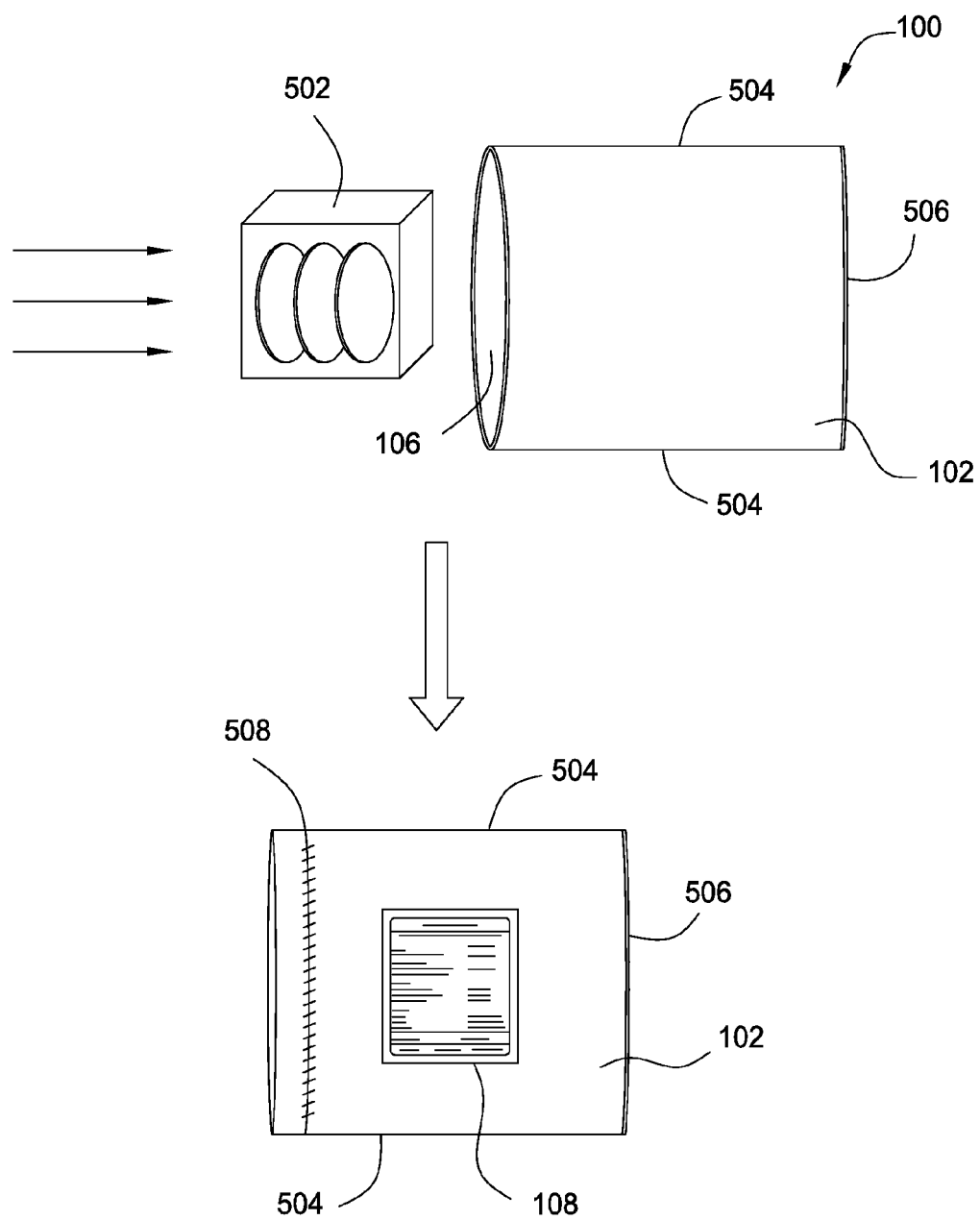
FIG. 5. An example embodiment of the present disclosure showing a fluoropolymer packaging article being used to store clean items.

In a particular embodiment of the present disclosure, packaging article 100 may be in the form of a fluoropolymer bag to be used as inner packaging bag for the transport of semiconductor device components, such as silicon wafers, or advanced optical components. Referring now to FIG. 5, a body 102 is in the form of a bag. The bag comprises a flexible fluoropolymer, for example PVDF, sheet folded along fold 506 and welded along welds 504, leaving opening 106. Silicon wafers or advanced optical components 502 (inside a wafer carrier) can be inserted into packaging article 100 through opening 106. Once silicon wafers or advanced optical components 502 are placed inside packaging article 100, the bag may be closed with sealing weld 508. Sealing weld 508 may be formed by heat welding or other methods previously discussed. Optional label 108 may be placed on the bag. Optional label 108 may in some embodiments have information provided as shown on the label depicted in FIG. 2.

Experimental Data

Uncleaned PVDF bags were obtained from a commercial vendor. For comparison purposes, a nylon bag marketed as suitable for use as an inner packaging bag for semiconductor industry applications was also obtained from a commercial vendor. One uncleaned PVDF bag was set aside for later comparison testing. One uncleaned bag was cleaned according to the method described above in reference to FIG. 4. Specifically, the cleaning method involved stagnant leach steps each lasting 60 minutes. That is, the IPA leach steps 410 and 420 each lasted for 60 minutes. And the nitric acid leach steps 450 and 460 also each lasted for 60 minutes. The cleaned PVDF bag was dried in the clean hood while clamped in an open position with the opening facing into the laminar flow of the clean hood. All other steps were as otherwise previously described in reference to FIG. 4.

The as-supplied nylon bag, the as-supplied uncleaned PVDF bag, and the cleaned PVDF bag were subjected to various analytical tests. Metallic contaminant and particle counts for these bags were as stated in Table 1 and Table 2, respectively. The results show that the as-supplied PVDF bag has generally higher metal contaminant levels (cleanliness levels) than the as-supplied nylon bag. But unlike the nylon bag commonly used today, a PVDF bag can be cleaned according to an embodiment of the present invention to make the PVDF bag suitable for storage and transport of clean items. As shown in Table 1 and Table 2, the cleaned PVDF bag has contaminant and particle levels superior to the nylon bag and the uncleaned PVDF bag.

Metal contaminant counts reported in Table 1 were measured using ICP-MS performed on rinse samples taken from the interior surfaces of the exemplar bags. The rinse was performed using 1% (w/w) aqueous nitric acid solutions. Other metals may be measured as required.

Particle counts (cleanliness levels) reported in Table 2 were measured using a laser particle counter on rinse samples taken for the interior surfaces of the exemplar bags. The rinse was performed using UPW.

The reported levels for nylon are for a standard nylon bag commercially available; the results are believed to be representative, but substantial variation bag-to-bag and lot-to-lot may be expected amongst such bags. Likewise the results reported for the pre-cleaned PVDF are believed to be representative of such bags, but substantial variation bag-to-bag and lot-to-lot may be expected amongst such bags.

Table 3 provides the results of measurements of the organic contamination levels (cleanliness levels) for a cleaned PVDF bag. The cleaned PVDF bag measured less than 1 nanogram/cm$^2$ ($1 \times 10^{-9}$ gram/cm$^2$) apiece of "low boilers" (carbon-containing compounds with seven to ten carbon atoms), "medium boilers" (carbon-containing compounds with eleven to twenty carbon atoms), and "high boilers" (carbon-containing compounds with greater than twenty carbon atoms). Organic contaminant levels reported in Table 3 were measured using gas chromatography-mass spectroscopy (GC-MS) on rinse samples taken from the interior surface of a cleaned PVDF bag. The rinse was performed using isopropyl alcohol (IPA).

Table 4 provides the results of measurements of the anionic contamination levels (cleanliness levels) for a cleaned PVDF bag. The cleaned PVDF bag measured $1 \times 10^{10}$ anion/cm$^2$ or less for fluoride (F$^-$), chloride (Cl$^-$), nitrite (NO$_2^-$), sulfate (SO$_4^{2-}$), and phosphate (HPO$_4^{2-}$) anions. Anionic contaminant levels reported in Table 4 were measured using ion chromatography on rinse samples taken from the interior surface of a cleaned PVDF bag. The rinse was performed using UPW.

TABLE 1

Metal Contaminants for example nylon bag and a PVDF bag before and after cleaning.

| Contaminant | Nylon | PVDF (Pre-clean) | PVDF (Post-clean) |
| --- | --- | --- | --- |
| Aluminum ($1 \times 10^{10}$ atoms/cm$^2$) | 40 | 130 | <1 |
| Calcium ($1 \times 10^{10}$ atoms/cm$^2$) | 120 | 280 | <1 |
| Copper ($1 \times 10^{10}$ atoms/cm$^2$) | 15 | 4 | <1 |
| Iron ($1 \times 10^{10}$ atoms/cm$^2$) | 3 | 42 | <1 |
| Magnesium ($1 \times 10^{10}$ atoms/cm$^2$) | 19 | 49 | <1 |
| Potassium ($1 \times 10^{10}$ atoms/cm$^2$) | 60 | 36 | <1 |
| Sodium ($1 \times 10^{10}$ atoms/cm$^2$) | 170 | 490 | <1 |
| Zinc ($1 \times 10^{10}$ atoms/cm$^2$) | 6 | 14 | <1 |

TABLE 2

Particle counts by particle size for an example pre- and post-clean PVDF bag. Count units are particles/cm² (of bag interior surface area).

| Particle Size | PVDF (Pre-clean) | PVDF (Post-clean) |
|---|---|---|
| >0.3 μm | 96.3 | 19.1 |
| >0.5 μm | 15.2 | 3.0 |
| >1 μm | 2.4 | 0.1 |
| >5 μm | 0.4 | 0.0 |

TABLE 3

Organic contamination levels for a post-clean PVDF bag. Levels are reported per unit area (of bag interior surface area).

| Organic Compound | Post Clean Level |
|---|---|
| Low Boilers (C7-C10) | $<1 \times 10^{-9}$ g/cm² |
| Medium Boilers (C11-C20) | $<1 \times 10^{-9}$ g/cm² |
| High Boilers (greater than C20) | $<1 \times 10^{-9}$ g/cm² |

TABLE 4

Anionic contamination levels for a post-clean PVDF bag. Levels are reported per unit area (of bag interior surface area).

| Anion | Post Clean Level |
|---|---|
| Fluoride | $<1 \times 10^{10}$ ion/cm² |
| Chloride | $1 \times 10^{10}$ ion/cm² |
| Nitrite | $<1 \times 10^{10}$ ion/cm² |
| Sulfate | $<1 \times 10^{10}$ ion/cm² |
| Phosphate | $<1 \times 10^{10}$ ion/cm² |

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of making a packaging article for clean items, comprising:
    providing a packaging article made of a fluoropolymer material;
    placing the packaging article in contact with a solution comprising an organic solvent, then rinsing the packaging article with ultrapure water;
    placing the packaging article in contact with an acid solution, then rinsing the packaging article with ultrapure water; and
    drying the packaging article to produce the packaging article having an interior surface with:
        less than $1 \times 10^{10}$ atoms/cm² of each of the following metals: aluminum, calcium, copper, iron, magnesium, potassium, sodium, and zinc;
        less than $1 \times 10^{10}$ ions/cm² for each of the following anions: fluoride, chloride, nitrite, sulfate, and phosphate; and
        less than 2 nanogram/cm² of each of the following organic compounds: compounds with seven to ten carbon atoms, compounds with eleven to twenty carbon atoms, and compounds with greater than 20 carbon atoms.

2. The method of claim 1, wherein the organic solvent comprises isopropyl alcohol ($C_3H_7OH$).

3. The method of claim 1, wherein the acidic solution comprises aqueous nitric acid ($HNO_3$).

4. The method of claim 1, wherein the contact with the organic solvent includes a stagnant leach step approximately 60 minutes long.

5. The method of claim 1, wherein the contact with the acidic solution includes a stagnant leach step approximately 60 minutes long.

6. The method of claim 1, wherein all steps are performed at ambient temperature.

7. The method of claim 1, wherein drying the packaging article comprises placing the packaging article in a clean hood.

8. The method of claim 1, further comprising: verifying a cleanliness level of the packaging article.

9. The method of claim 8, wherein verifying the cleanliness level is done using a laser particle counter.

10. The method of claim 8, further comprising: sorting the packaging article by the cleanliness level.

11. A method for storing clean items, comprising:
    obtaining a packaging article made of fluoropolymer material, the packaging article having been cleaned according to a process comprising steps of:
        placing the packaging article in contact with a solution comprising an organic solvent, then rinsing the packaging article with ultrapure water;
        placing the packaging article in contact with an acid solution, then rinsing the packaging article with ultrapure water; and
        drying the packaging article to produce the packaging article having an interior surface with:
            less than $1 \times 10^{10}$ atoms/cm² of each of the following metals: aluminum, calcium, copper, iron, magnesium, potassium, sodium, and zinc;
            less than $1 \times 10^{10}$ ions/cm² for each of the following anions: fluoride, chloride, nitrite, sulfate, and phosphate; and
            less than 2 nanogram/cm² of each of the following organic compounds: compounds with seven to ten carbon atoms, compounds with eleven to twenty carbon atoms, and compounds with greater than 20 carbon atoms;
    placing an item or items inside the packaging article; and
    sealing the packaging article.

12. The method of claim 11, wherein the sealing of the packaging article comprises heat welding.

13. The method of claim 11, wherein the item placed in the packaging article is an advanced optical component.

14. A method of making a packaging article for clean semiconductor and microelectronic devices, components, and sub-assemblies comprising:
    providing the packaging article made of a fluoropolymer material;
    producing the packaging article having an interior surface with:
        less than $1 \times 10^{10}$ atoms/cm² of each of the following metals: aluminum, calcium, copper, iron, magnesium, potassium, sodium, and zinc;
        less than $1 \times 10^{10}$ ions/cm² for each of the following anions: fluoride, chloride, nitrite, sulfate, and phosphate; and
        less than 2 nanogram/cm² of each of the following organic compounds: compounds with seven to ten carbon atoms, compounds with eleven to twenty carbon atoms, and compounds with greater than 20 carbon atoms, by contacting the packaging article with a solution comprising an organic solvent, rinsing the packaging article with ultrapure water, contacting the packaging article with an acid solution, and rinsing the packaging article with ultrapure water, and drying the packaging article.

15. The method of claim 14, wherein the fluoropolymer material is selected from the group consisting of perfluoroalkoxy (PFA), polytetrafluoroethylene (PTFE), fluorinated ethylene propylene (FEP), perfluoropolyether (PFPE), and polyvinylidene fluoride (PVDF).

16. The method of claim 14, wherein the acid solution is 1% (w/w) aqueous nitric acid ($HNO_3$).

17. The method of claim 14, wherein the acid solution is a mixture of sulfuric and nitric acids.

18. The method of claim 14, the acid solution further comprising hydrogen peroxide ($H_2O_2$).

19. A method of making a packaging article for clean items, comprising:
  providing a packaging article made of a fluoropolymer material;
  placing the packaging article in contact with a solution comprising an organic solvent selected from the group consisting of methanol, ethanol, acetone and benzene, then rinsing the packaging article with ultrapure water;
  placing the packaging article in contact with an acid solution, then rinsing the packaging article with ultrapure water; and
  drying the packaging article to produce the packaging article having an interior surface with:
    less than $1 \times 10^{10}$ atoms/$cm^2$ of each of the following metals: aluminum, calcium, copper, iron, magnesium, potassium, sodium, and zinc;
    less than $1 \times 10^{10}$ ions/$cm^2$ for each of the following anions: fluoride, chloride, nitrite, sulfate, and phosphate; and
    less than 2 nanogram/$cm^2$ of each of the following organic compounds: compounds with seven to ten carbon atoms, compounds with eleven to twenty carbon atoms, and compounds with greater than 20 carbon atoms.

* * * * *